US012580561B2

(12) United States Patent
Pala et al.

(10) Patent No.: US 12,580,561 B2
(45) Date of Patent: Mar. 17, 2026

(54) SWITCHING SLEW RATE CONTROL OF CASCODE SWITCH DEVICE AND GATE DRIVER THEREOF

(71) Applicant: Monolithic Power Systems, Inc., Kirkland, WA (US)

(72) Inventors: Vipindas Pala, San Jose, CA (US); Xiao-chang Cheng, Kirkland, WA (US); Di Han, San Jose, CA (US)

(73) Assignee: Monolithic Power Systems, Inc., Kirkland, WA (US)

( * ) Notice: Subject to any disclaimer, the term of this patent is extended or adjusted under 35 U.S.C. 154(b) by 111 days.

(21) Appl. No.: 18/543,088

(22) Filed: Dec. 18, 2023

(65) Prior Publication Data

US 2025/0202474 A1      Jun. 19, 2025

(51) Int. Cl.
*H03K 17/00* (2006.01)
*H03K 17/0812* (2006.01)
*H03K 17/16* (2006.01)

(52) U.S. Cl.
CPC ..... *H03K 17/162* (2013.01); *H03K 17/08122* (2013.01); *H03K 2217/94047* (2013.01)

(58) Field of Classification Search
CPC ........... H03K 17/162; H03K 17/08122; H03K 2217/94047; H03K 17/687; H03K 17/6871
See application file for complete search history.

(56) References Cited

U.S. PATENT DOCUMENTS

| | | | | |
|---|---|---|---|---|
| 4,518,926 A | * | 5/1985 | Swanson | H03F 3/505 |
| | | | | 330/288 |
| 4,523,111 A | * | 6/1985 | Baliga | H03K 17/06 |
| | | | | 327/388 |
| 5,051,618 A | * | 9/1991 | Lou | H03K 17/102 |
| | | | | 326/120 |
| 6,335,638 B1 | | 1/2002 | Kwong | |
| 9,176,569 B2 | * | 11/2015 | Chen | G06F 1/324 |
| 10,218,350 B2 | * | 2/2019 | Roig-Guitart | H03K 17/165 |
| 11,088,688 B2 | | 8/2021 | Pala | |
| 2020/0195245 A1 | * | 6/2020 | Randolph | H03K 17/165 |
| 2020/0195246 A1 | * | 6/2020 | Randolph | H03K 17/04123 |
| 2020/0259489 A1 | * | 8/2020 | Pala | H10D 30/475 |

* cited by examiner

*Primary Examiner* — Tuan T Lam
(74) *Attorney, Agent, or Firm* — Perkins Coie LLP

(57) ABSTRACT

A cascode switch device includes a normally-on switch device, a normally-off switch device, and a gate driver. The normally-on switch device has a first terminal, a second terminal and a control terminal. The normally-off switch device has a first terminal, a second terminal and a control terminal. The first terminal of the normally-off switch device is coupled to the second terminal of the normally-on switch device, and the control terminal of the normally-off switch device is coupled to the control terminal of the normally-on switch device. The gate driver is configured to provide a gate driver signal to the control terminal of the normally-on switch device to control a switching slew rate of a voltage at the first terminal of the normally-on switch device. The normally-on switch device is turned on or turned off in response to the gate driver signal.

20 Claims, 4 Drawing Sheets

800

100

102

102

106

_200_
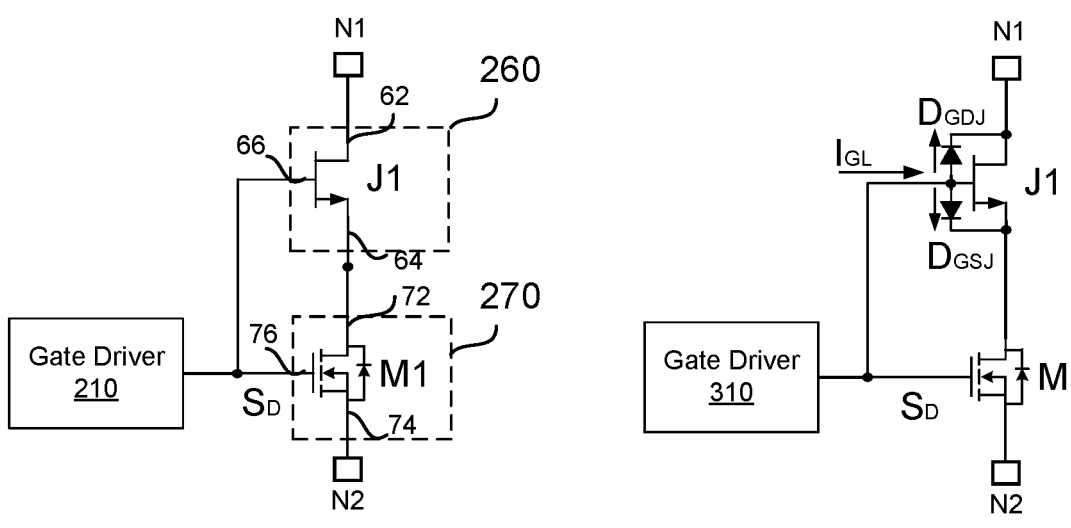
N1
FIG. 2
_300_
N1
FIG. 3
_400_
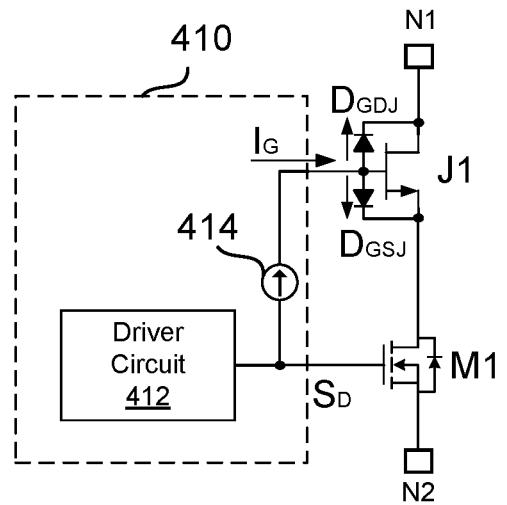
FIG. 4
_500_
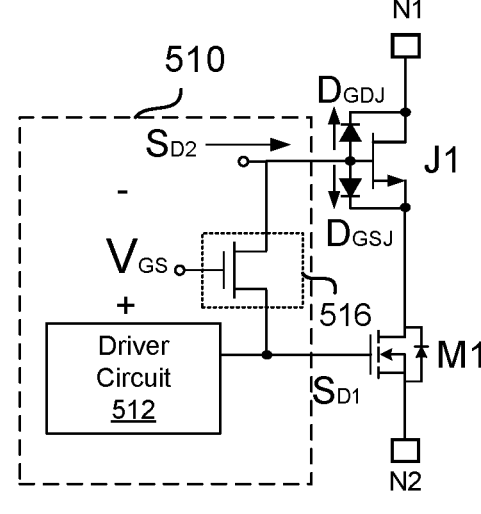
FIG. 5

600

800

880

SWITCHING SLEW RATE CONTROL OF CASCODE SWITCH DEVICE AND GATE DRIVER THEREOF

TECHNICAL FIELD

The present disclosure relates generally to power circuits, and more particularly but not exclusively to a cascode switch device.

BACKGROUND OF THE INVENTION

For high-power applications such as vehicle powertrain, data center, cloud computing, and AI, wide bandgap (WBG) semiconductors are often used for power switching operations. A cascode switch device having a normally-on switch device and a normally-off switch device connected in series are often used in high voltage applications. The normally-on switch device is a high-voltage transistor (HVT), e.g., a SiC/GaN JFET. The normally-off switch device is a low-voltage transistor (LVT), e.g., a Si MOSFET.

Generally, in a conventional cascode configuration circuit, there is a lack of control on a switching slew rate (dV/dt) of a drain voltage at a drain terminal of the cascode switch device, resulting in excessive ringing, or high electromagnetic interference, which are undesirable for the stability of the system. Further, during switching transition, due to high voltage spike at the drain terminal of the cascode switch device, the voltage at a drain terminal of the normally-off FET device may have a value above a safe operating voltage, which also leads to high power dissipation.

Therefore, it is desirable to provide a way to control the switching slew rate of the drain voltage of the cascode switch device.

SUMMARY OF THE INVENTION

According to an embodiment of the present disclosure, a cascode switch device is provided. The cascode switch device includes a normally-on switch device, a normally-off switch device, and a gate driver. The normally-on switch device has a first terminal, a second terminal and a control terminal. The normally-off switch device has a first terminal, a second terminal and a control terminal. The first terminal of the normally-off switch device is coupled to the second terminal of the normally-on switch device, and the control terminal of the normally-off switch device is coupled to the control terminal of the normally-on switch device. The gate driver is configured to provide a gate driver signal to the control terminal of the normally-on switch device to control a switching slew rate of a voltage at the first terminal of the normally-on switch device. The normally-on switch device is turned on or turned off in response to the gate driver signal.

According to another embodiment of the present disclosure, a power switch device is provided. The power switch device includes a first transistor, a second transistor and a gate driver. The wide-bandgap semiconductor switch has a first terminal, a second terminal and a control terminal. The first transistor has a first source, a first drain and a first gate. The second transistor has a second source, a second drain and a second gate. The gate driver is configured to provide a gate driver signal to the first gate of the first transistor to control a switching slew rate of a voltage at the first drain of the first transistor. The first transistor is turned on or turned off in response to the gate driver signal.

According to yet another embodiment of the present disclosure, a gate driver for driving a cascode switch device is provided. The cascode switch device has a normally-on switch device and a normally-off switch device. The gate driver includes a driver circuit. The driver circuit is configured to provide a gate driver signal to a control terminal of the normally-on switch device and a control terminal of the normally-off switch device to control a switching slew rate of a voltage at a first terminal of the normally-on switch device. The normally-on switch device is turned on or turned off in response to the gate driver signal

BRIEF DESCRIPTION OF THE DRAWINGS

The present disclosure can be further understood with reference to the following detailed description and appended drawings, where like elements are provided with like reference numerals. These drawings are only for illustration purpose, thus may only show part of the devices and are not necessarily drawn to scale.

FIG. 2 schematically shows a cascode switch device in accordance with one embodiment of the present disclosure.

FIG. 3 schematically shows a cascode switch device in accordance with one embodiment of the present disclosure.

FIG. 4 schematically shows a cascode switch device in accordance with another embodiment of the present disclosure.

FIG. 5 schematically shows a cascode switch device in accordance with yet another embodiment of the present disclosure.

DETAILED DESCRIPTION

Various embodiments of the present disclosure will now be described. In the following description, some specific details, such as example circuits and example values for these circuit components, are included to provide a thorough understanding of embodiments. One skilled in the relevant art will recognize, however, that the present disclosure can be practiced without one or more specific details, or with other methods, components, materials, etc. In other instances, well-known structures, materials, processes or operations are not shown or described in detail to avoid obscuring aspects of the present disclosure.

Throughout the specification and claims, the phrases "in one embodiment", "in some embodiments", "in one implementation", and "in some implementations" as used includes both combinations and sub-combinations of various features described herein as well as variations and modifications thereof. These phrases used herein do not necessarily refer to the same embodiment, although it may. Those skilled in the art should understand that the meanings of the terms identified above do not necessarily limit the terms, but merely provide illustrative examples for the terms. It is noted that when an element is "connected to" or "coupled to" the other element, it means that the element is directly connected to or coupled to the other element, or indirectly connected to or coupled to the other element via another element. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

Figure 1A:
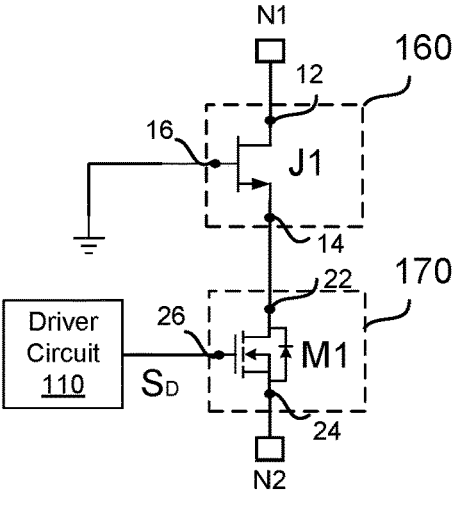
FIGS. 1A-1D are schematic circuit diagrams of conventional cascode switch devices.

FIG. 1A is a schematic circuit diagram of a conventional cascode switch device 100. As shown in FIG. 1A, the cascode switch device 100 includes a normally-on switch device 160 and a normally-off switch device 170. In one embodiment, the normally-on switch device 160 is a Junction Field-Effect Transistor (JFET) J1. In one embodiment, the normally-off switch device 170 is a Metal-Oxide-Semiconductor Field-Effect Transistor (MOSFET) M1. The JFET J1 has a first terminal 12 (e.g., drain), a second terminal 14 (e.g., source) and a control terminal 16 (e.g., gate). The MOSFET M1 has a first terminal 22 (e.g., drain), a second terminal 24 (e.g., source) and a control terminal 26 (e.g., gate).

The JFET J1 is in serially connected with the MOSFET M1. Specifically, the first terminal 12 (e.g., drain) of the JFET J1 is coupled to a first node N1, the second terminal 14 (e.g., source) of the JFET J1 is coupled to the first terminal 22 (e.g., drain) of the MOSFET M1, and the second terminal 24 (e.g., source) of the MOSFET M1 is coupled to a second node N2.

As shown in FIG. 1A, the gate terminal 16 of the JFET J1 is coupled to the ground. In one embodiment, the cascode switch device 100 further includes a driver circuit 110. The driver circuit 110 is configured to provide a driver signal Sp to control the MOSFET M1. The driver signal Sp is provided to the control terminal of the MOSFET M1 to turn on or turn off the MOSFET M1, and the operation of the JFET J1 is controlled according to the operation of the MOSFET M1. When the MOSFET M1 is turned off, the source terminal of the JFET J1 (i.e., the drain to source (VDs) of the MOSFET M1) is at a high voltage level, and therefore the gate to source voltage of the JFET J1 is reverse biased and reaches a pinch-off voltage of the JFET, causing the JFET J1 to be OFF. When the MOSFET M1 is turned on, the JFET J1 is also turned on.

Figure 1B:
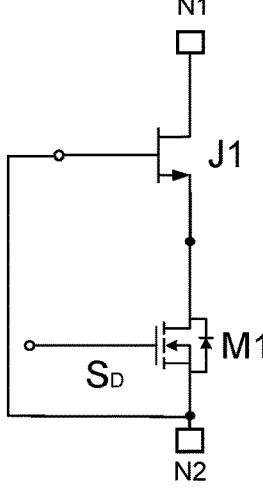

As shown in FIG. 1B, the gate terminal of the SiC JFET J1 is coupled to the source terminal of the Si MOSFET M1. Similarly, when the MOSFET M1 is turned on, the JFET J1 is also turned on. When the MOSFET M1 is turned off, the JFET J1 is turned off.

Figure 1C:
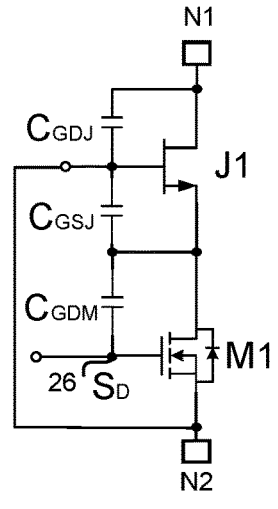

For the conventional cascode switch device 100 or 102, a switching slew rate (dV/dt) of the drain voltage is controlled by adjusting charging/discharging current through a gate terminal of the MOSFET M1 to the drain terminal of the JFET J1 via Miller capacitance. As shown in FIG. 1C, the Miller capacitance includes a capacitance $C_{GDM}$ between the gate terminal of the MOSFET M1 and the drain terminal of the MOSFET M1, a capacitance $C_{GSJ}$ between the gate terminal of the JFET J1 and the source terminal of the JFET J1, and a capacitance $C_{GDJ}$ between the gate terminal of the JFET J1 and the drain terminal of the JFET J1. However, the capacitance $C_{GDJ}$ of the JFET J1 is connected across the drain voltage of the JFET J1 and a fixed bias voltage at the source terminal of the MOSFET M1. Therefore, charging and discharging of the capacitance $C_{GDJ}$ is independent of current from the gate terminal 26 of the MOSFET M1, thereby direct control over switching slew rate is not easily achieved.

Figure 1D:
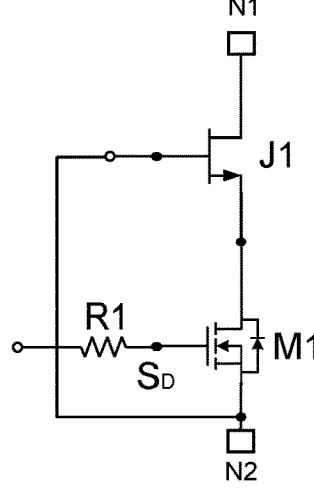

For controlling the switching slew rate, a gate resistor R1 is connected to the gate terminal of the MOSFET M1 (as shown in FIG. 1D) to slow down the switching speed. However, the turn on/off delay time becomes large since the MOSFET M1 is significantly slowed down.

FIG. 2 schematically shows a cascode switch device 200 in accordance with one embodiment of the present disclosure. The cascode switch device 200 includes a normally-on switch device 260 and a normally-off switch device 270.

As shown in FIG. 2, the normally-on switch device 260 is in serially connected with the normally-off switch device 270. Specifically, the first terminal 62 of the normally-on switch device 260 is coupled to a first node N1, the second terminal 64 of the normally-on switch device 260 is coupled to the first terminal 72 of the normally-off switch device 270, and the second terminal 74 of the normally-off switch device 270 is coupled to a second node N2. The control terminal 76 of the normally-off switch device 270 is coupled to the control terminal 66 of the normally-on switch device 260.

In one embodiment, the normally-on switch device 260 is a Junction Field-Effect Transistor (JFET) J1. In one embodiment, the normally-off switch device 270 is a Metal-Oxide-Semiconductor Field-Effect Transistor (MOSFET) M1. The JFET J1 has a first terminal 62 (e.g., drain), a second terminal 64 (e.g., source) and a control terminal 66 (e.g., gate). The MOSFET M1 has a first terminal 72 (e.g., drain), a second terminal 74 (e.g., source) and a control terminal 76 (e.g., gate). The JFET J1 is a high voltage normally-on (depletion mode) device, while the Si MOSFET M1 is a low voltage normally-off (enhancement mode) device. For instance, the JFET J1 is able to sustain high voltage level higher than 100 volts; and the MOSFET M1 operates at a voltage level lower than 100 volts.

In one embodiment, the normally-on switch device 260 includes a wide-bandgap (WBG) semiconductor switch. In one implementation, the WBG semiconductor switch P1 includes silicon carbide (SiC) material. In another implementation, the WBG semiconductor switch includes gallium nitride (GaN) material. In some other implementations, the WBG semiconductor switch includes WBG semiconductor materials having a bandgap energy greater than a bandgap energy of the silicon, such as diamond, III-V semiconductor materials, and II-VI semiconductor materials. III-V semiconductor materials may include essentially one element from group III and one element from group V, for instance, boron nitride (BN), aluminum nitride (AlN), aluminium phosphide (AlP), gallium phosphide (GaP), and gallium arsenide (GaAs). II-VI semiconductor materials may include a metal from either group 2 or 12 of the periodic table and a nonmetal element from group VI, for instance, cadmium sulfide (CdS), cadmium telluride (CdTE), zinc oxide (ZnO), zinc sulfide (ZnS), and zinc selenide (ZnSe).

In another embodiment, the normally-on switch device 260 includes a Metal-Oxide-Semiconductor Field-Effect Transistor (MOSFET) having a first terminal (e.g., drain), a second terminal (e.g., source) and a control terminal (e.g., gate). In yet another embodiment, the normally-on switch device 160 includes a High Electron Mobility Transistor (HEMT).

In one implementation, the normally-off switch device 270 is manufactured on a silicon (Si) substrate. The normally-off switch device 270 includes, a bipolar transistor (BJT), a field-effect transistor (FET), or an insulated-gate bipolar transistor (IGBT), a MOSFET, a HEMT, a JFET, a Gate Turn-off Thyristor (GTO) or a Gate-Commutated Thyristor (GCT).

In one embodiment, the cascode switch device 200 further includes a gate driver 210. In one implementation, the gate driver 210 is manufactured on a silicon (Si) substrate. In one implementation, the cascode switch device 200 is an integrated circuit (IC), for instance, the JFET J1 is integrated on a SiC die, and the gate driver 210 and the MOSFET M1 are integrated on a Si die and are co-packaged with the SiC die. In another implementation, the JFET J1 is integrated on an IC, and the gate driver 210 and the MOSFET M1 are integrated in another IC.

In one embodiment, the cascode switch device 200 is a power switch device used in a switching mode power supply. For example, the power switch device is one of the switches in a boost converter. In another example, the power switch device is one of the switches in buck converter. In yet another example, the power switch device is one of the switches in a buck-boost converter. In one implementation, the power switch device is one of the switches in a switched-capacitor circuit. In another implementation, the power switch device is a load switch. In other instances, the power switch device is one of the switches in an LLC converter. In some other instances, the power switch device is one of the switches in a bridge circuit (half-bridge or full-bridge). In some other implementations, the power switch device is a synchronous rectifier. In some embodiments, the power switch device may include more WBG semiconductor switches to function as the above-mentioned switching mode power supply. Accordingly, the gate driver 210 provides the corresponding driving signal to the WBG semiconductor switches.

In one embodiment, the power switch device is an IC having multiple pins. For instance, a Vcc pin is configured to receive a power supply voltage, a GND pin is configured to be coupled to a reference ground, a N1 pin is coupled to a first terminal (e.g., drain) of the normally-on switch device, and a N2 pin is coupled to a second terminal (e.g., source) of the normally-off switch device. In some embodiments, the power switch device further includes one or more pins configured to receive and/or transmit enable signals, sense signals, monitor signals, control signals and/or data.

The gate driver 210 is configured to provide a gate driver signal Sp to the control terminal 66 of the normally-on switch device 260 to control a switching slew rate (dV/dt) of a voltage at the first terminal 62 of the normally-off switch device 260. The normally-on switch device 260 is turned on or turned off in response to the gate driver signal $S_D$. Specifically, the operation of the JFET J1 is directly controlled according to the gate driver signal Sp. When the MOSFET M1 is turned off, the JFET J1 is also turned off. When the MOSFET M1 is turned on, the JFET J1 is also turned on.

However, when the gate terminal of the JFET J1 is coupled to the gate terminal of the MOSFET M1, a huge current may flow to the gate terminal of the JFET J1. Since there is gate leakage current $I_{GL}$ via the pn junction (e.g., diodes $D_{GDJ}$ and $D_{GSJ}$ as shown in FIG. 3) of the JFET J1, which may damage the device, in one embodiment, the gate driver further includes a current limiting circuit to limit the gate current $I_G$.

FIG. 4 schematically shows a cascode switch device 400 in accordance with another embodiment of the present disclosure. As shown in FIG. 4, the gate driver 410 includes a driver circuit 412 and a current limiting circuit 414. The current limiting circuit 414 is configured to provide a limited current flowing to the control terminal (e.g., gate) of the normally-on switch device (e.g., JFET J1). In one embodiment, the current limiting circuit 414 is a current source.

FIG. 5 schematically shows a cascode switch device 500 in accordance with yet another embodiment of the present disclosure. As shown in FIG. 5, the gate driver 510 includes a driver circuit 512 and a voltage drop circuit 516. The driver circuit 510 is configured to provide a driver signal $S_{D1}$ to the gate terminal of the MOSFET M1. The voltage drop circuit 516 is coupled between the gate terminal of the JFET J1 and the gate terminal of the MOSFET M1. That is, the voltage drop circuit 516 is configured to provide the gate driver signal $S_{D2}$ to the gate terminal of the JFET J1, and the gate driver signal is lower than the driver signal (e.g., $S_{D2}=S_{D1}-\Delta V$, where $\Delta V$ is the drop voltage). For instance, when the gate voltage of the MOSFET M1 is 3.3V, the gate voltage of the JFET J1 is 2.5V, and thus the gate current of the JFET J1 could be lower.

In one embodiment, the voltage drop circuit 516 is a switch (e.g., a MOSFET). However, the present disclosure is not limited thereto. The voltage drop circuit 516 may include resistors, diodes, and/or transistors.

Figure 6:
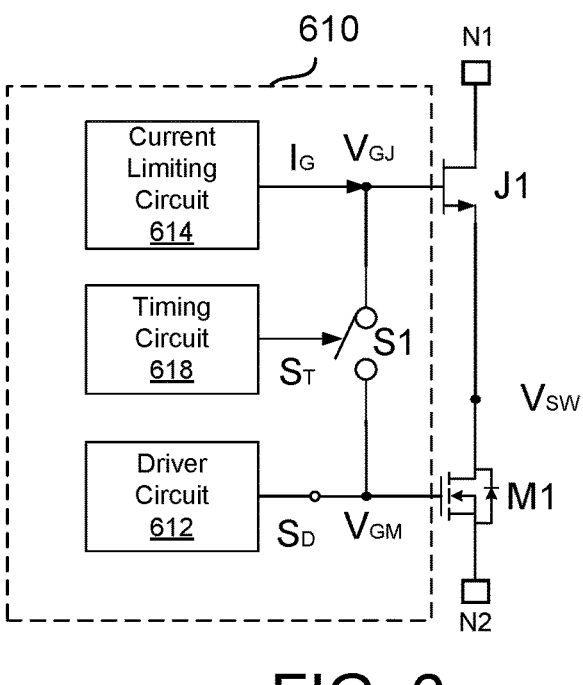
FIG. 6 schematically shows a cascode switch device in accordance with yet another embodiment of the present disclosure.

FIG. 6 schematically shows a cascode switch device 600 in accordance with yet another embodiment of the present disclosure. As shown in FIG. 6, the gate driver 610 includes a driver circuit 612, a current limiting circuit 614, a switch S1, and a timing circuit 618. The timing circuit 618 is configured to provide a control signal ST to turn on the switch S1 when the MOSFET M1 is turned on in response to the driver signal $S_D$.

Figure 7:
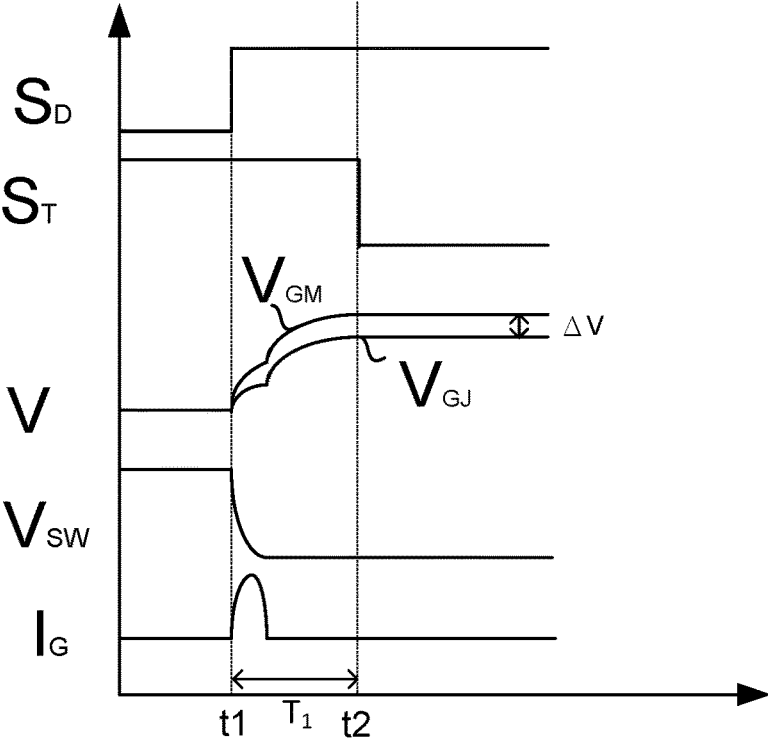
FIG. 7 shows a simulated waveforms of signals of a gate driver as shown in FIG. 6 in accordance with an embodiment of the present disclosure.

FIG. 7 shows a simulated waveforms of signals of a gate driver 610 as shown in FIG. 6 in accordance with an embodiment of the present disclosure. At time t1, the driver signal $S_D$ provided by the driver circuit 612 transitions from a low voltage level to a high voltage level to turn the MOSFET M1. Meanwhile, the timing circuit 618 provides a control signal ST with a high voltage level to turn on the switch S1. Accordingly, as the gate voltage $V_{GM}$ of the MOSFET M1 increases, the gate voltage $V_{GJ}$ of the JFET J1 also increases (with a lower voltage value, e.g., $V_{GJ}=V_{GM}-\Delta V$, where $\Delta V$ is the drop voltage of the switch S1). During the MOSFET M1 is switched on, i.e., the drain voltage $V_{SW}$ of the MOSFET M1 transitions from a high voltage level to a low voltage level, since the switch S1 is turned on, a larger current is able to charge the gate capacitance $C_{GDJ}$ between the gate to drain voltage of the JFET J1. That is, the gate current $I_G$ is allowed to have a larger value to quickly charge the capacitor and change the drain voltage of the JFET J1 to have a higher switching speed. After a time period $T_1$, at time t2, the timing circuit 618 provides the control signal ST with a low voltage level to turn off the switch S1. At the same time, the current limiting circuit 614 limits the gate current flowing to the gate terminal of the JFET J1.

Figure 8:
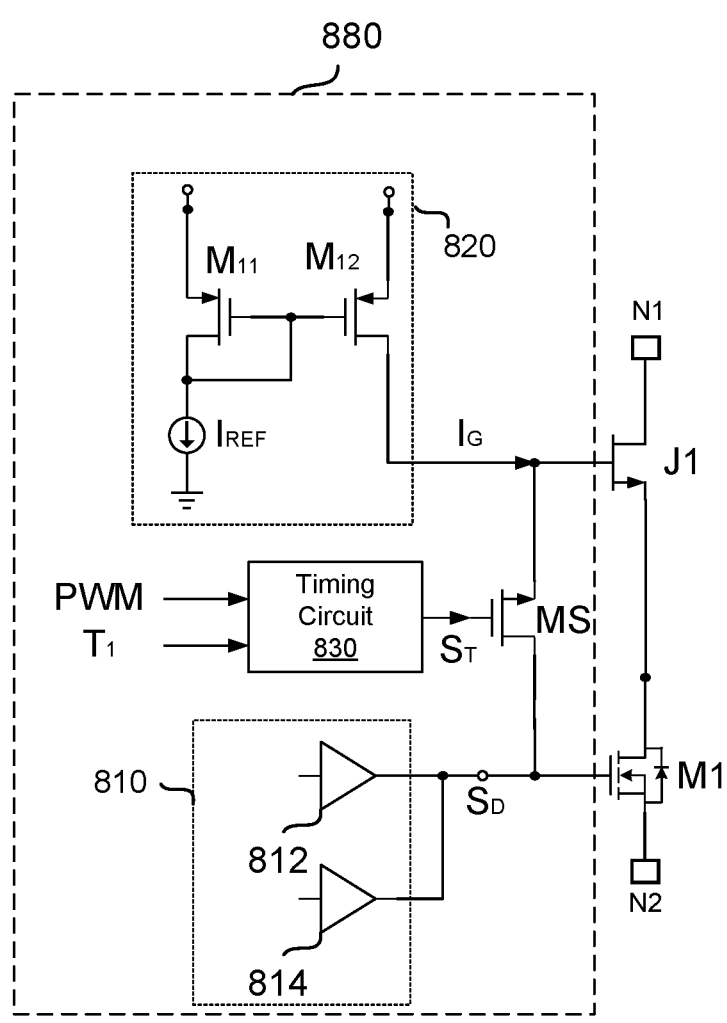
FIG. 8 shows a power switch device in accordance with yet another embodiment of the present disclosure.

FIG. 8 shows a power switch device 800 in accordance with yet another embodiment of the present disclosure. As shown in FIG. 8, the power switch device includes a first transistor J1, a second transistor M1, and a gate driver 880. The gate driver 880 includes a driver circuit 810, a current source 820, a timing circuit 830, and a transistor MS. The driver circuit 810 is configured to provide a driver signal $S_D$ to the gate of the transistor M1. In one embodiment, the driver circuit 810 includes a first driver 812 and a second driver 814. The first driver 812 and the second driver 814 has different driving capability or driving strength. The driving capability or the driving strength relates to the amount of time it takes to switch the power switch (e.g., from off to on, or from on to off), i.e., the switching slew rate. For instance, a higher drive capability is used for fast switching speed, while a lower drive capability is used for slower switching speed. The driving capability or the driving strength is determined by a ratio between the amount of current the driver conducts over the voltage at the output of the driver. For example, to achieve a higher driving strength, a transistor with a larger W/L ratio is used, where W is a channel width of the transistor and L is a channel length of the transistor.

The current source 820 is configured to provide a limited current $I_G$ flowing to the gate of the transistor J1. For example, the current source 820 is realized by a current mirror having transistors M11, M12 and a reference current source $I_{REF}$.

The transistor MS is coupled between the gate of the transistor J1 and the gate of the transistor M1. The transistor MS is configured to be turned on to provide the gate driver signal to the gate of the transistor J1, and a voltage of the gate driver signal is lower than a voltage of the driver signal $S_D$.

The timing circuit 830 is configured to provide a control signal ST to turn on the transistor MS when the transistor M1 is turned on (e.g., according to PWM signal of the transistor M1). The timing circuit 830 is further configured to provide the control signal ST to turn off the transistor MS a time period (e.g., $T_1$) after the transistor M1 is turned on.

Although the cascode switch device of FIGS. 2-6, and the power switch device of FIG. 8 only shows a serially connected normally-on switch device and a normally-off switch device. However, the present disclosure is not limited thereto. The cascode switch device may have one or more resistors, capacitors and other components and circuits coupled to the source, gate, or drain terminal of the normally-on switch device or the normally-off switch device.

Based on the above, the present disclosure provides various cascode switch devices, power switch devices and gate drivers thereof to control the switching slew rate of the normally-on switch device. It will be appreciated by persons skilled in the art that the present disclosure is not limited to what has been particularly shown and described herein above. Rather the scope of the present disclosure is defined by the claims and includes both combinations and sub-combinations of the various features described hereinabove as well as variations and modifications thereof which would occur to persons skilled in the art upon reading the foregoing description and which are not in the prior art.

What is claimed is:

1. A cascode switch device, comprising:
   a normally-on switch device having a first terminal, a second terminal and a control terminal;
   a normally-off switch device having a first terminal, a second terminal and a control terminal, wherein the first terminal of the normally-off switch device is coupled to the second terminal of the normally-on switch device, and the control terminal of the normally-off switch device is coupled to the control terminal of the normally-on switch device; and
   a gate driver configured to provide a gate driver signal to the control terminal of the normally-on switch device to control a switching slew rate of a voltage at the first terminal of the normally-on switch device;
   wherein the gate driver comprises:
      a first driver configured to provide a driver signal with a first driving capability to the control terminal of the normally-off switch device; and
      a second driver configured to provide a driver signal with a second driving capability different from the first driving capability to the control terminal of the normally-off switch device; and wherein the normally-on switch device is turned on or turned off in response to the gate driver signal.

2. The cascode switch device of claim 1, wherein the gate driver comprises:
   a current limiting circuit configured to provide a limited current flowing to the control terminal of the normally-on switch device.

3. The cascode switch device of claim 1, wherein the gate driver comprises:
   a voltage drop circuit coupled between the control terminal of the normally-on switch device and the control terminal of the normally-off switch device, wherein the voltage drop circuit is configured to provide the gate driver signal to the control terminal of the normally-on switch device, and a voltage of the gate driver signal is lower than a voltage of the driver signal.

4. The cascode switch device of claim 3, wherein the voltage drop circuit comprises a switch, and the gate driver further comprises:
   a timing circuit configured to provide a control signal to turn on the switch when the normally-off switch device is turned on in response to the driver signal.

5. The cascode switch device of claim 4, wherein the timing circuit is further configured to provide the control signal to turn off the switch a time period after the normally-off switch device is turned on.

6. The cascode switch device of claim 4, wherein the gate driver further comprises:
   a current limiting circuit configured to provide a limited current flowing to the control terminal of the normally-on switch device after the time period.

7. The cascode switch device of claim 1, wherein the normally-on switch device includes a wide-bandgap (WBG) semiconductor switch, and the WBG semiconductor switch is integrated on a first die, and the gate driver and the normally-off switch device are integrated on a second die.

8. A power switch device, comprising:
   a first transistor having a first source, a first drain and a first gate; and
   a second transistor having a second source, a second drain and a second gate;
   a gate driver configured to provide a gate driver signal to the first gate of the first transistor to control a switching slew rate of a voltage at the first drain of the first transistor;
   wherein the gate driver comprises:
      a first driver configured to provide a driver signal with a first driving capability to the control terminal of the second transistor; and
      a second driver configured to provide a driver signal with a second driving capability different from the first driving capability to the control terminal of the second transistor;
   wherein the first transistor is turned on or turned off in response to the gate driver signal.

9. The power switch device of claim 8, wherein the gate driver comprises:
   a current source configured to provide a limited current flowing to the first gate of the first transistor.

10. The power switch device of claim 8, wherein the gate driver comprises:
   a third transistor coupled between the first gate of the first transistor and the second gate of the second transistor, wherein the third transistor is configured to be turned on to provide the gate driver signal to the first gate of the first transistor, and a voltage of the gate driver signal is lower than a voltage of the driver signal.

11. The power switch device of claim 10, wherein the gate driver further comprises:

a timing circuit configured to provide a control signal to turn on the third transistor when the second transistor is turned on in response to the driver signal.

12. The power switch device of claim 11, wherein the timing circuit is further configured to provide the control signal to turn off the third transistor a time period after the second transistor is turned on.

13. The power switch device of claim 11, wherein the gate driver further comprises:

a current source configured to provide a limited current flowing to the first gate of the first transistor after the time period.

14. The power switch device of claim 11, wherein the first transistor includes a Junction Field-Effect Transistor (JFET), and the second transistor includes a Metal-Oxide-Semiconductor Field-Effect Transistor (MOSFET).

15. The power switch device of claim 11, wherein the first transistor includes is integrated on a WBG die, and the gate driver and the second transistor are integrated on a second die.

16. A gate driver for driving a cascode switch device having a normally-on switch device and a normally-off switch device, wherein the gate driver comprises:

a driver circuit configured to provide a gate driver signal to a control terminal of the normally-on switch device and a control terminal of the normally-off switch device to control a switching slew rate of a voltage at a first terminal of the normally-on switch device;

wherein the driver circuit comprises:

a first driver configured to provide a driver signal with a first driving capability to the control terminal of the normally-off switch device; and a second driver configured to provide a driver signal with a second driving capability different from the first driving capability to the control terminal of the normally-off switch device;

wherein the normally-on switch device is turned on or turned off in response to the gate driver signal.

17. The gate driver of claim 16, further comprising:

a current limiting circuit configured to provide a limited current flowing to the control terminal of the normally-on switch device.

18. The gate driver of claim 16, further comprising:

a voltage drop circuit coupled between the control terminal of the normally-on switch device and the control terminal of the normally-off switch device, wherein the voltage drop circuit is configured to receive and driver signal and provide the gate driver signal to the control terminal of the normally-on switch device, and a voltage of the gate driver signal is lower than a voltage of the driver signal.

19. The gate driver of claim 18, wherein the voltage drop circuit comprises a switch, and the gate driver further comprises:

a timing circuit configured to provide a control signal to turn on the switch when the normally-off switch device is turned on in response to the driver signal.

20. The gate driver of claim 19, wherein the timing circuit is further configured to provide the control signal to turn off the switch a time period after the normally-off switch device is turned on.

* * * * *